United States Patent [19]
Carlson

[11] Patent Number: 5,621,604
[45] Date of Patent: Apr. 15, 1997

[54] PWM MULTIPLEXED SOLENOID DRIVER

[75] Inventor: Peter J. Carlson, Saratoga, Calif.

[73] Assignee: Siliconix, Inc., Santa Clara, Calif.

[21] Appl. No.: 480,469

[22] Filed: Jun. 7, 1995

Related U.S. Application Data

[63] Continuation of Ser. No. 3,172, Jan. 12, 1993.

[51] Int. Cl.$^6$ .................................................. H01H 47/32
[52] U.S. Cl. ........................ 361/166; 361/160; 361/167; 307/38; 307/39; 323/271; 323/272; 123/490
[58] Field of Search .................................. 361/166, 167, 361/168.1, 169.1, 152, 153, 154, 160; 123/490, 643; 364/424.05; 307/37, 38, 41, 39; 323/267, 271, 272, 287, 279, 282, 286, 351

[56] References Cited

U.S. PATENT DOCUMENTS

| | | | |
|---|---|---|---|
| 3,305,764 | 2/1967 | Todd | 323/279 |
| 4,295,177 | 10/1981 | Woodhouse et al. | 361/154 |
| 4,453,652 | 6/1984 | Merkel et al. | 222/504 |
| 4,511,945 | 4/1985 | Nielsen | 361/154 |
| 4,535,879 | 8/1985 | Sturges | 192/52 |
| 4,612,619 | 9/1986 | Culp | 307/38 |
| 4,625,622 | 12/1986 | Gunda et al. | 91/36 |
| 4,661,882 | 4/1987 | Presley | 361/153 |
| 4,905,120 | 2/1990 | Grembowicz et al. | 323/272 |
| 4,980,793 | 12/1990 | Glowczewski et al. | 361/154 |
| 5,022,301 | 6/1991 | Stahnke | 84/21 |
| 5,113,158 | 5/1992 | Tsuji et al. | 332/109 |
| 5,202,813 | 4/1993 | Uota et al. | 361/154 |
| 5,237,262 | 8/1993 | Ashley | 361/154 |
| 5,255,152 | 10/1993 | Estes, III | 361/160 |

Primary Examiner—David S. Martin
Assistant Examiner—Peter Ganjoo
Attorney, Agent, or Firm—Skjerven, Morrill, MacPherson, Franklin & Friel; David T. Millers

[57] ABSTRACT

This invention relates to driving solenoid and motor loads while providing the means for fast turn on and fast turn off. Many applications including automotive fuel injector drivers, Anti-Skid Braking (ABS) solenoid and motor drivers, and other electro-mechanical motion control require the ability to quickly turn on or off a number of devices. The invention utilizes a bridge architecture to drive the loads and to turn on and off individual devices. The invention employs a diode and a switch for each device controlled plus a single master diode and a single master switch. The invention thereby reduces the number of components needed to control N devices to 2*N+2 from prior art half bridge circuit 4*N. Novel techniques and algorithms are used to multiplex the single master switch and control multiple inductive devices. The system provides redundant control and error checking means to preclude single point failure mechanisms.

9 Claims, 13 Drawing Sheets

TURN ON LOAD CURRENT

TURN ON LOAD CURRENT (I_L)

TURN OFF LOAD CURRENT $$I_L(t) = I_O + \left(\frac{V_{BAT} + 2V_D}{R}\right) EXP(-t/_{L/R}) - \frac{V_{BAT} + 2V_D}{R}$$

TURN OFF LOAD CURRENT

FREEWHEELING CURRENT

PWM MULTIPLEXED SOLENOID DRIVER

This application is a continuation of application Ser. No. 08/003,172, filed Jan. 12, 1993.

FIELD OF THE INVENTION

This invention relates to circuits which drive a number of electronic devices, such as solenoids and motor loads, and more particularly relates to circuits that provide a means for fast turn on and turn off of electronic devices.

BACKGROUND OF THE INVENTION

Devices which convert electrical energy to mechanical energy generally convert only part of the electrical energy into useful work. The rest of the input electrical energy is converted into other forms. Some energy may be lost to friction as heat. Some energy may be stored as potential energy in electric or magnetic fields, or potential energy of compressed springs.

Solenoids designed to provide fast turn off by means of mechanical springs store significant energy in spring compression and in magnetic fields. Solenoid drive systems which control these solenoids must handle the stored energy when the solenoid shuts off. Some drive systems simply dissipate this energy as heat. These systems are very energy inefficient, and they suffer from the problems associated with disposing of the generated heat. Such systems must accept high thermal stresses, and they inefficiently use semiconductors as heat dissipators in linear operation. Such systems need large heat sinks, and have reliability problems due to high semiconductor junction temperatures.

A schematic diagram of a contemporary solenoid driver is shown in FIG. 1. Typically, the solenoid 101 has an inductive coil with inductance $L_s$ and resistance $R_s$, an iron piston, and a spring. The iron piston is located so that when there is sufficient current running through the coil, a magnetic field generated by the coil draws the iron piston into the coil. The spring connects to the piston and to a fixed support so that when the iron piston is drawn into the coil the spring is either stretched or compressed. To turn on the solenoid 101, a voltage is applied to the gate of transistor 102 so that the transistor 102 allows current to flow through the solenoid 101 and the transistor 102. During turn on, energy is stored in the magnetic field and the mechanical spring.

When the power to a solenoid 101 is turned off, the inductance in the solenoid does not let the current through the solenoid 101 fall immediately to zero. Instead the solenoid 101 generates a voltage to oppose the change in current. This voltage is equal to the time derivative of the current times the inductance. As the solenoid 101 shuts down, stored energy provides the power to maintain a current.

If the current is cut off quickly the time derivative is large and the voltage generated in the solenoid 101 can drive a current through the circuit. Heat energy is dissipated in the power transistor 102 during turn off by resistive heating.

In a typical solenoid system of this type which cycles solenoid power on and off at a rate of 90 Hz, approximately 60% to 80% of the power dissipation is dissipation of stored energy. Heat sink size and power transistor size are therefore mostly determined by the need to dissipate stored energy, and technology advances aimed at improving transistor energy efficiency for a given device size are largely irrelevant.

The prior art half bridge architecture shown in FIG. 2 solves the problem of energy dissipation in the power transistor by providing a path to return stored energy to the power source. Two transistors 202 and 203 and two diodes 206 and 207 are used to turn a solenoid 201 on or off.

FIG. 3 shows the operation of the half bridge circuit of FIG. 2 when the solenoid is being turned on. In FIG. 3, the predominant current flows through the transistor 303, the solenoid 301, and transistor 302. The solenoid 301 is driven from zero current to its steady state current with the exponential rise characteristic of current for inductive and resistive circuits (LR circuits). FIG. 4 shows the characteristic current rise in a solenoid circuit when a constant voltage is applied.

FIG. 5 shows the operation of the same half bridge during turn off of the solenoid 501. With both transistors 502 and 503 off, the current decreases, causing a voltage across the solenoid 501. The induced voltage continues to drive the current in the original direction, through the solenoid 501. This current can most easily flow through the two diodes 504 and 505 as shown in FIG. 5. The path through the transistors 502 and 503 is blocked when the transistors are off. As seen from the current path $I_L$ in FIG. 5, the current flows from the ground 506, through diode 504, through the solenoid 501, and through the diode 505 to the positive terminal 507 of a power supply. The power source polarity is effectively reversed from when the transistors are on, so the power source forces a rapid decay of current. Current is also forced through the power supply thereby returning energy to the power supply.

FIG. 6 shows the effect a change in polarity has on current in an LR circuit. Without the diodes, a power supply with reversed polarity would eventually turn the current around and force a current of equal steady state magnitude in the opposite of the original direction.

The current direction is not reversed in the half bridge circuit of FIGS. 2, 3, and 5 because the diodes 505 and 504 go to a high impedance state when reverse voltage biased (at zero current). Current through the solenoid 501 stops, and the solenoid is not reactivated by a reversed current.

A disadvantage of the prior art half bridge architecture when employed for driving solenoids is the cost of circuit components, diodes and transistors. The prior art half bridge requires a minimum of four circuit components per solenoid. N solenoids require 4*N components. A system with fewer components can be cheaper.

Another problem with current solenoid control circuits is solenoid design. DC circuit solenoid design is restricted by conflicting requirements on solenoid wire resistance. The resistance must be high to control current and minimize resistive heating in the solenoid. When the steady state current is reached, power generation in the solenoid=$V^2/R$. The resistance of the solenoid needs to be high so that the solenoid will not over heat when driven by the highest anticipated voltage. However, for fast activation of the solenoid the ratio L/R should be high. With a fixed inductance fast activation requires lower resistances. With solenoid drivers as configured in FIG. 1 a compromise must be chosen to accommodate both goals.

SUMMARY OF INVENTION

The present invention is embodied by circuits which control inductive devices and by novel methods for operating circuits which control inductive devices. Inductive devices are devices with significant inductance.

The embodiment of the invention shown in FIG. 7 reduces the number of components needed to control N inductive devices from 4*N to 2*N+2. The smaller number of components means less expense. If this embodiment of the invention controls a large number of inductive devices, the cost savings over prior art can be significant.

Another advantage of the circuit shown in FIG. 7 results when it is employed in systems such as anti-skid braking systems (ABS). Safety considerations in ABS systems require that the system be disabled to allow normal braking function in the event of a failure of any one component. Since the circuit requires two switches to turn on or keep on any solenoid, the multiplexed master switch ($Q_0$) may be used as a safety shutdown. FIG. 9 shows a higher level systems architecture where a microprocessor 901 can take control and shut down the master switch 919 if the microprocessor 901 detects a fault in the circuit.

A further advantage of the invention is the simple testing methods which can test for shorted or open semiconductor switches or open solenoid windings. FIG. 9 shows the microprocessor 901 monitoring the common node 902 of the solenoids while relatively high value resistors ($R_1$, $R_2$ about 1K ohm) connects that node to $V_{BAT}$ and ground 909.

A still further advantage is that the system architecture can employ a serial communication link 904 between a microprocessor 901 and a switch controller 906, and this communication link can employ coding redundancy to improve safety. In this way, a malfunctioning or runaway microprocessor is unlikely to produce the required code that would unexpectedly turn on a solenoid. The coding can employ maximal distance coding redundancy and error correction, and be biased toward error correction that turns the solenoids off in the event of noise or microprocessor errors.

BRIEF DESCRIPTION OF THE DIAGRAMS

FIG. 3 shows the predominant current path in the same prior art half bridge circuit when the solenoid is activated by both transistors being on.

Figure 12A:
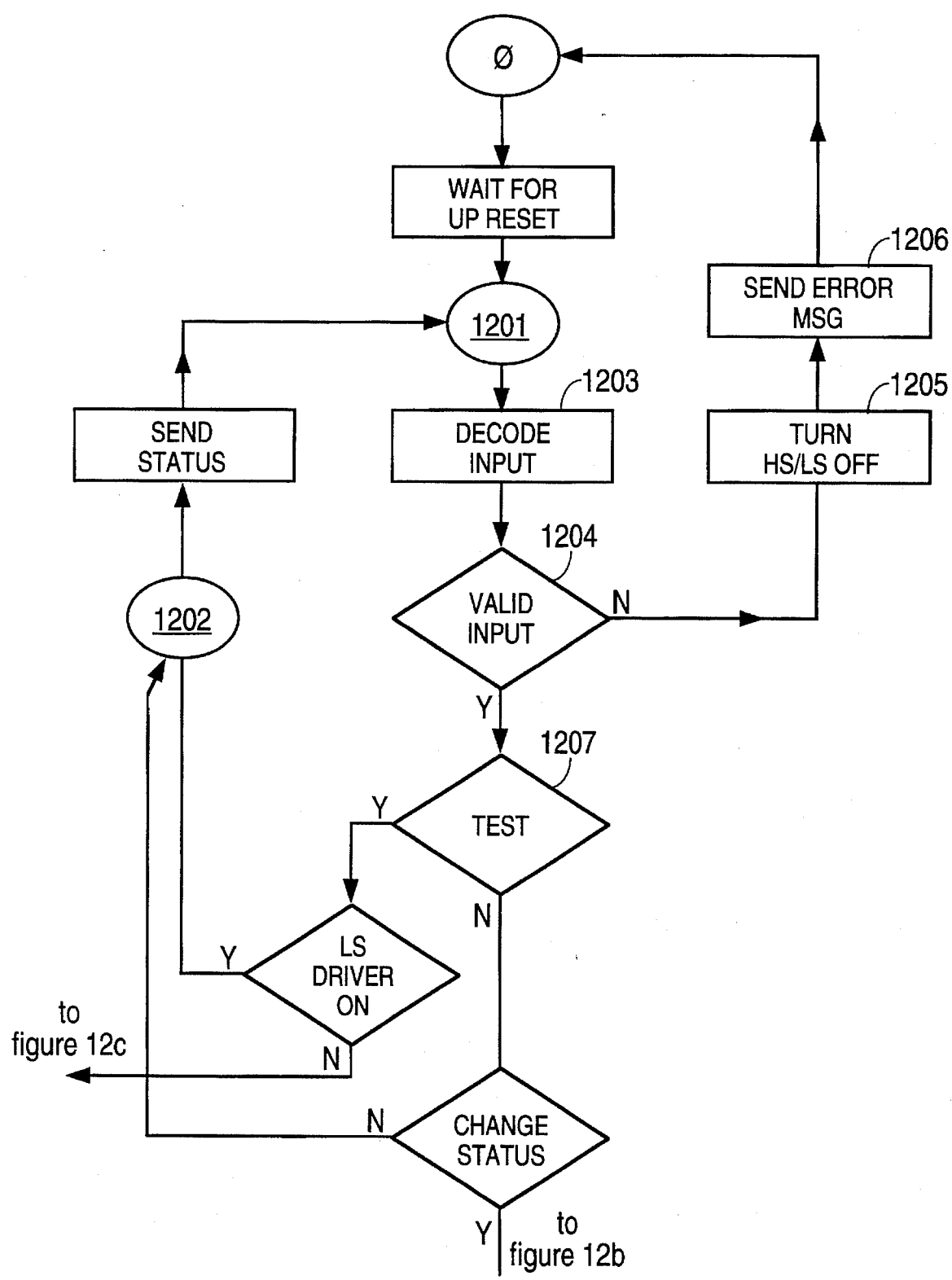
Figure 12B:
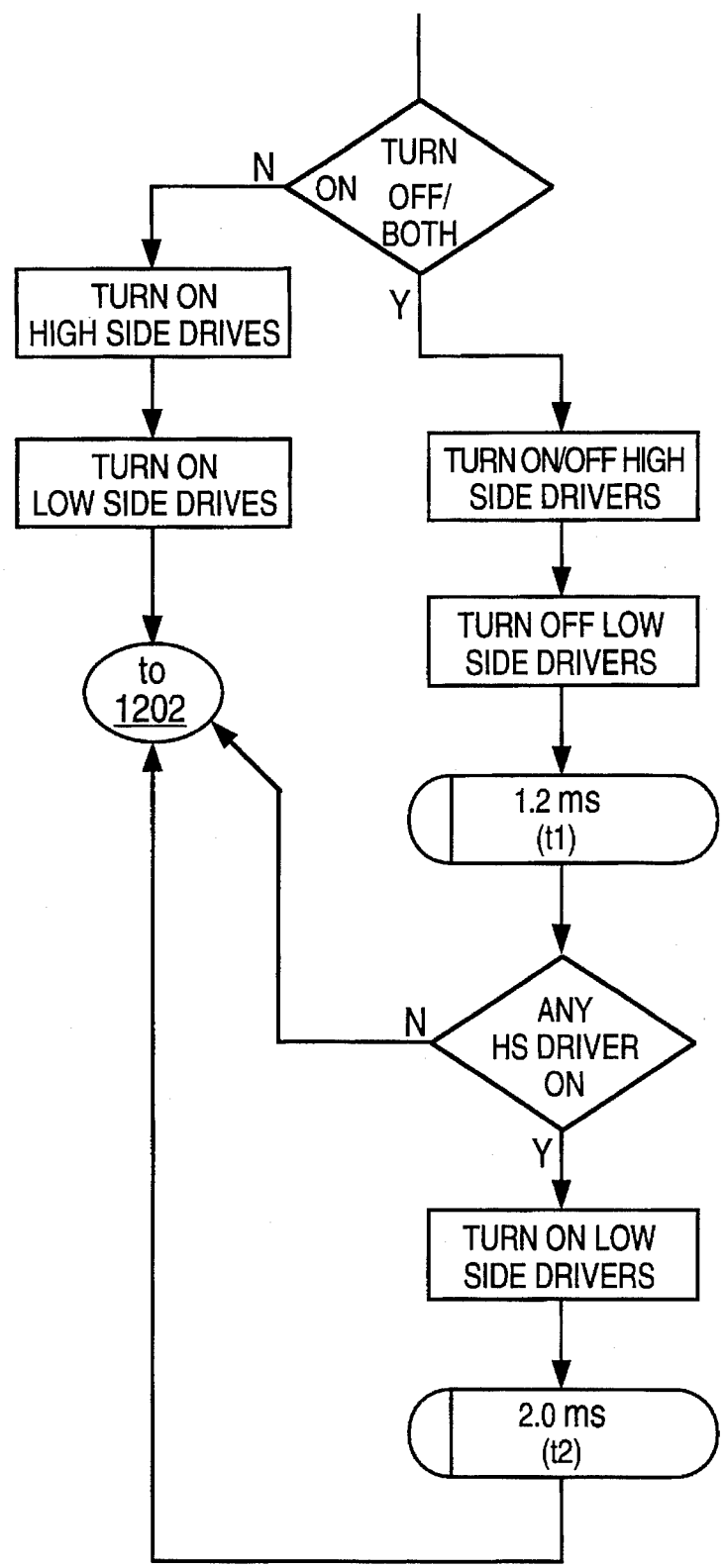
Figure 12C:
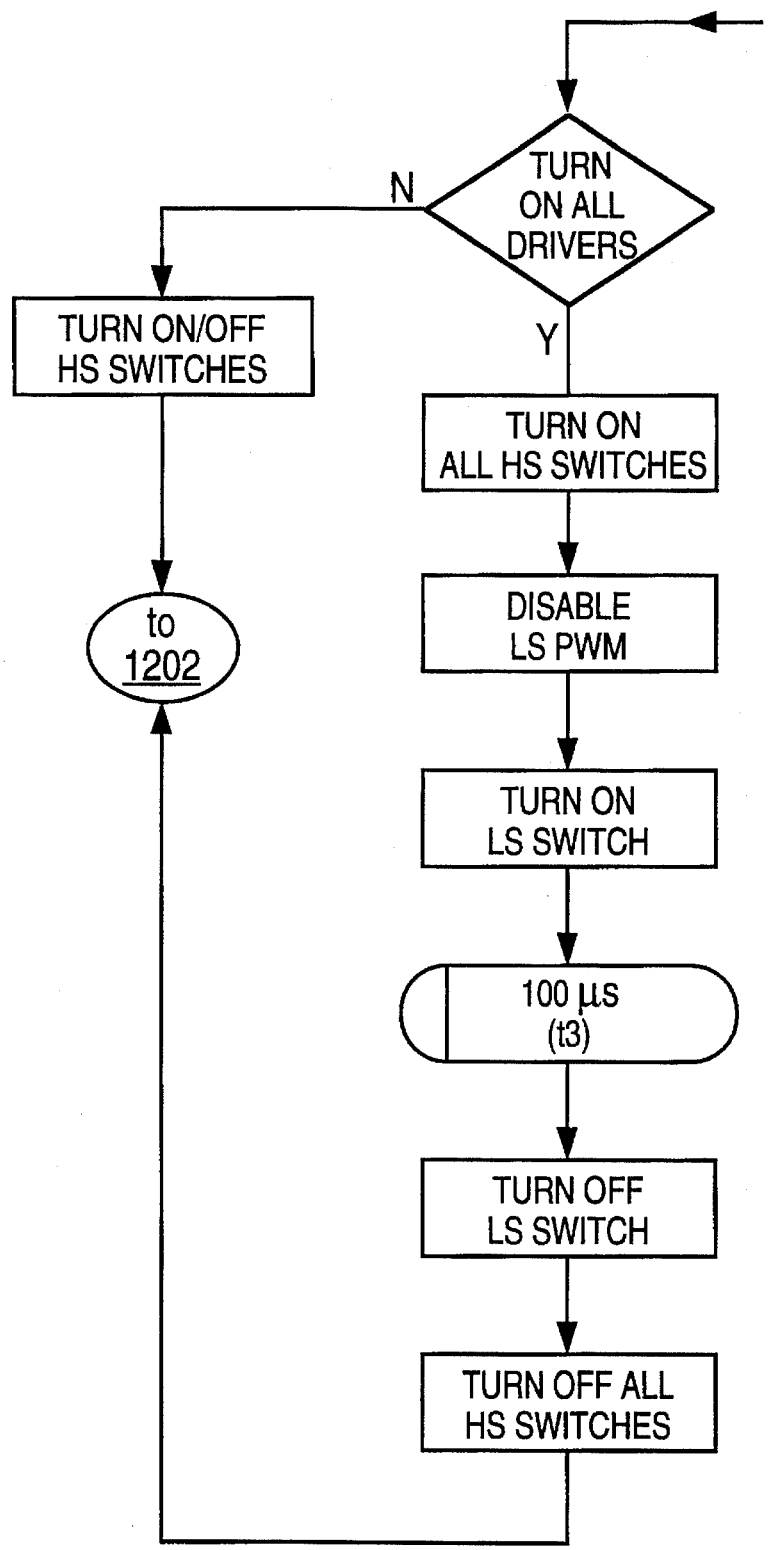

FIGS. 12a, 12b, and 12c show a flow diagram of logic used in an embodiment of the invention which turns solenoids off and on and checks the circuit for malfunctions.

DETAILED DESCRIPTION

Embodiments of the present invention shown here may be used to control a variety of inductive devices, that is to control devices with significant inductance. The most typical anticipated use is as a solenoid driver circuit. In the most of remaining description, solenoids are used as an example application of the invention, but it should be apparent from the description that solenoids can be replaced by any inductive device without materially changing the operation of the circuits described.

Figure 1:
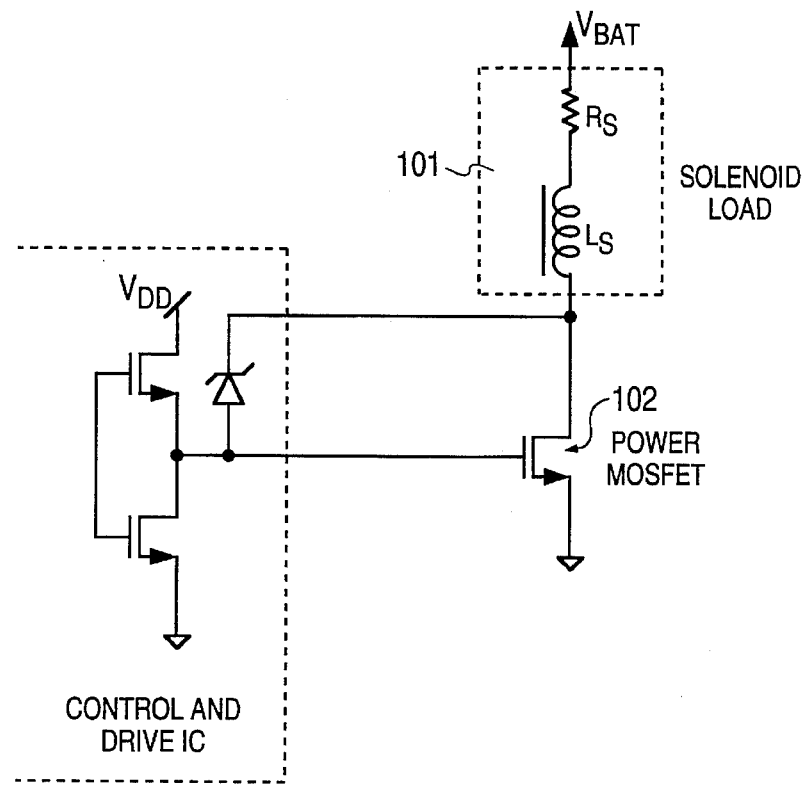
FIG. 1 shows a circuit diagram of a prior art solenoid and drive circuit.
Figure 2:
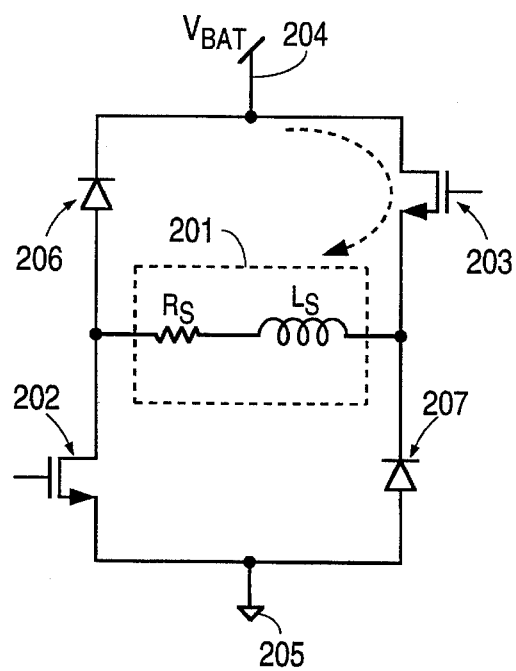
FIG. 2 show a circuit diagram of a prior art half bridge solenoid drive circuit.
Figure 3:
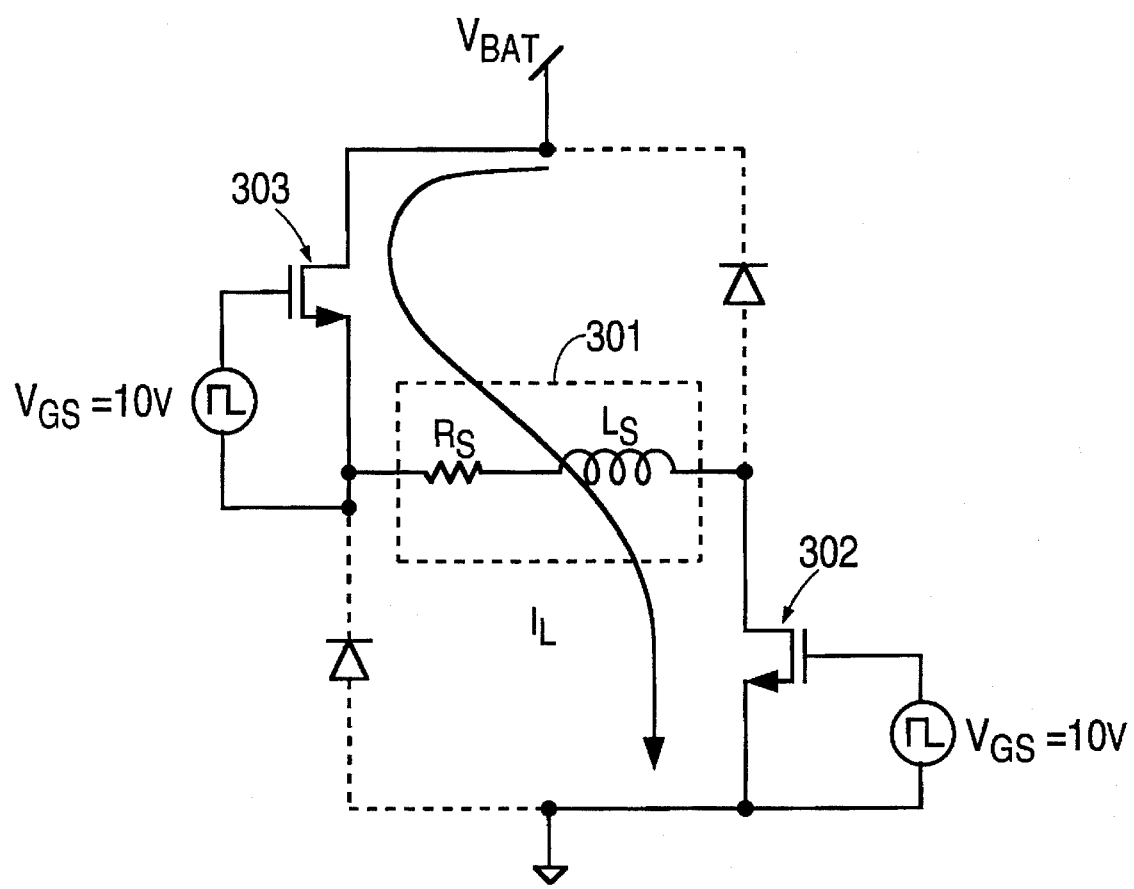
Figure 4:
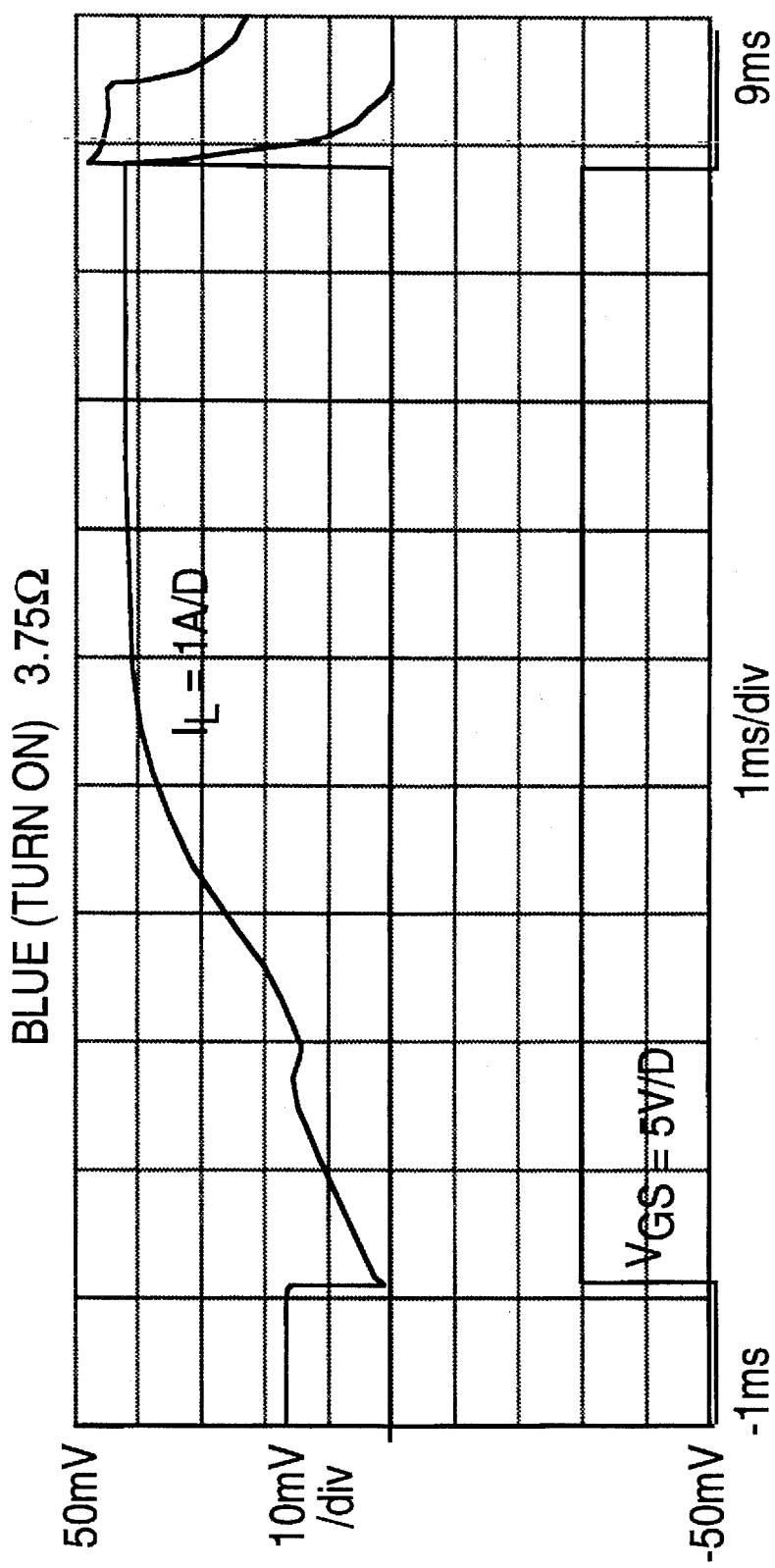
FIG. 4 shows an experimental plot of current through solenoid $I_L$, verses time. The plot is typical of the way current exponentially approaches a steady state after a voltage is applied to solenoid circuit.
Figure 5:
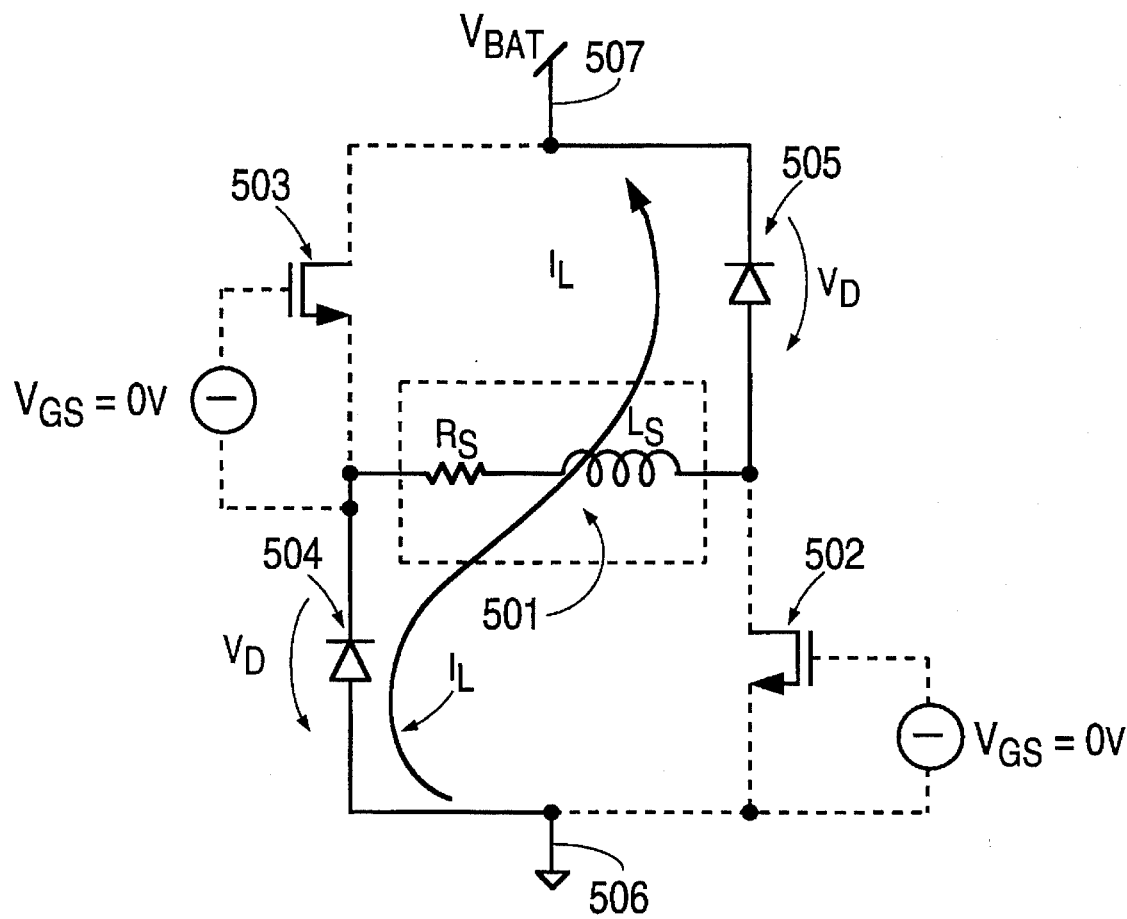
FIG. 5 shows a circuit diagram of the same prior art half bridge solenoid driver as in FIGS. 2 and 3, but also displays the predominant current path when the solenoids is turned off by both transistors in the half bridge circuit being off.
Figure 6:
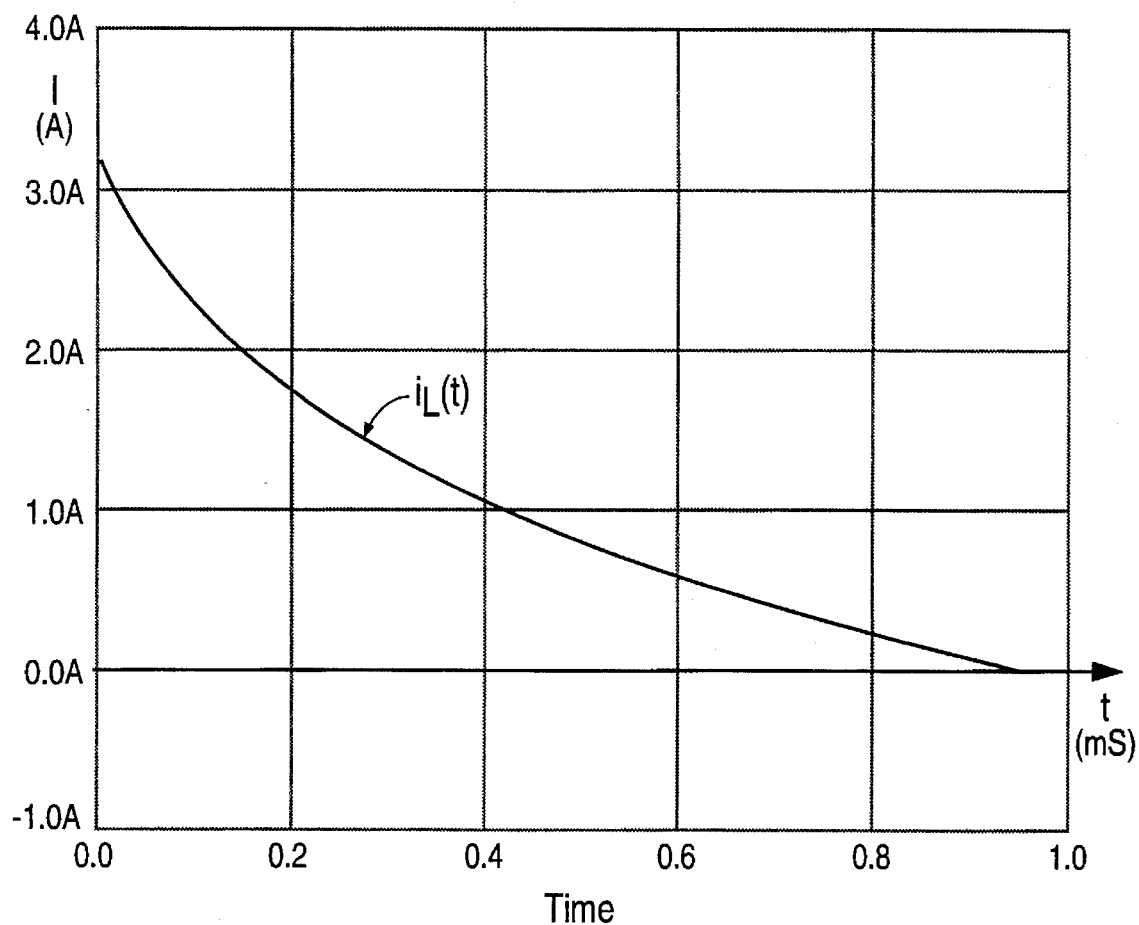
FIG. 6 is a plot of current verses time which shows the characteristic exponential drop of current when a power supply polarity is reversed in an LR circuit.
Figure 7:
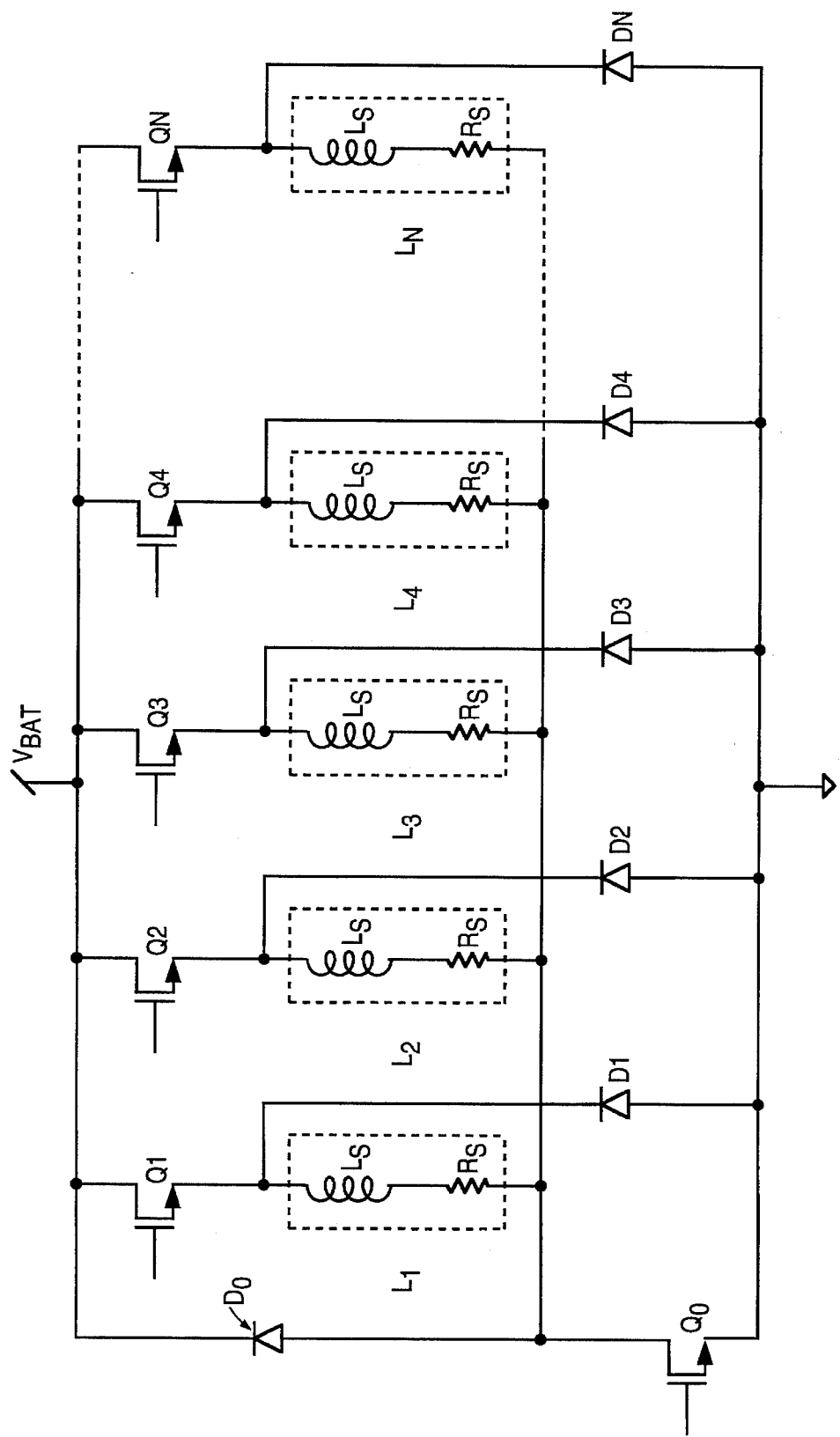
FIG. 7 is a circuit diagram showing an embodiment of the invention used to control N inductive devices.
Figure 8:
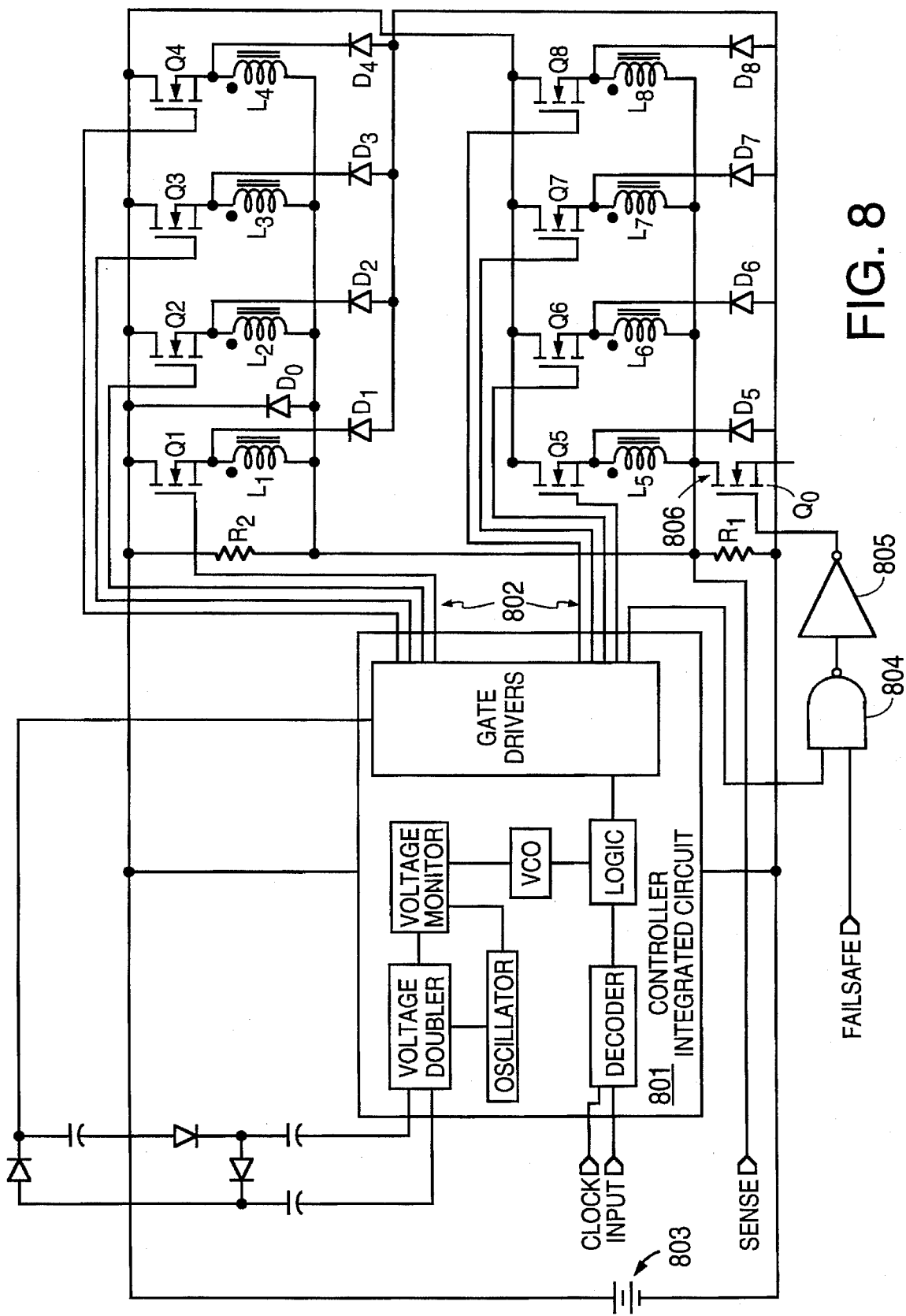
FIG. 8 is a circuit diagram of an embodiment of the invention which controls eight solenoids and includes a controller.
Figure 9:
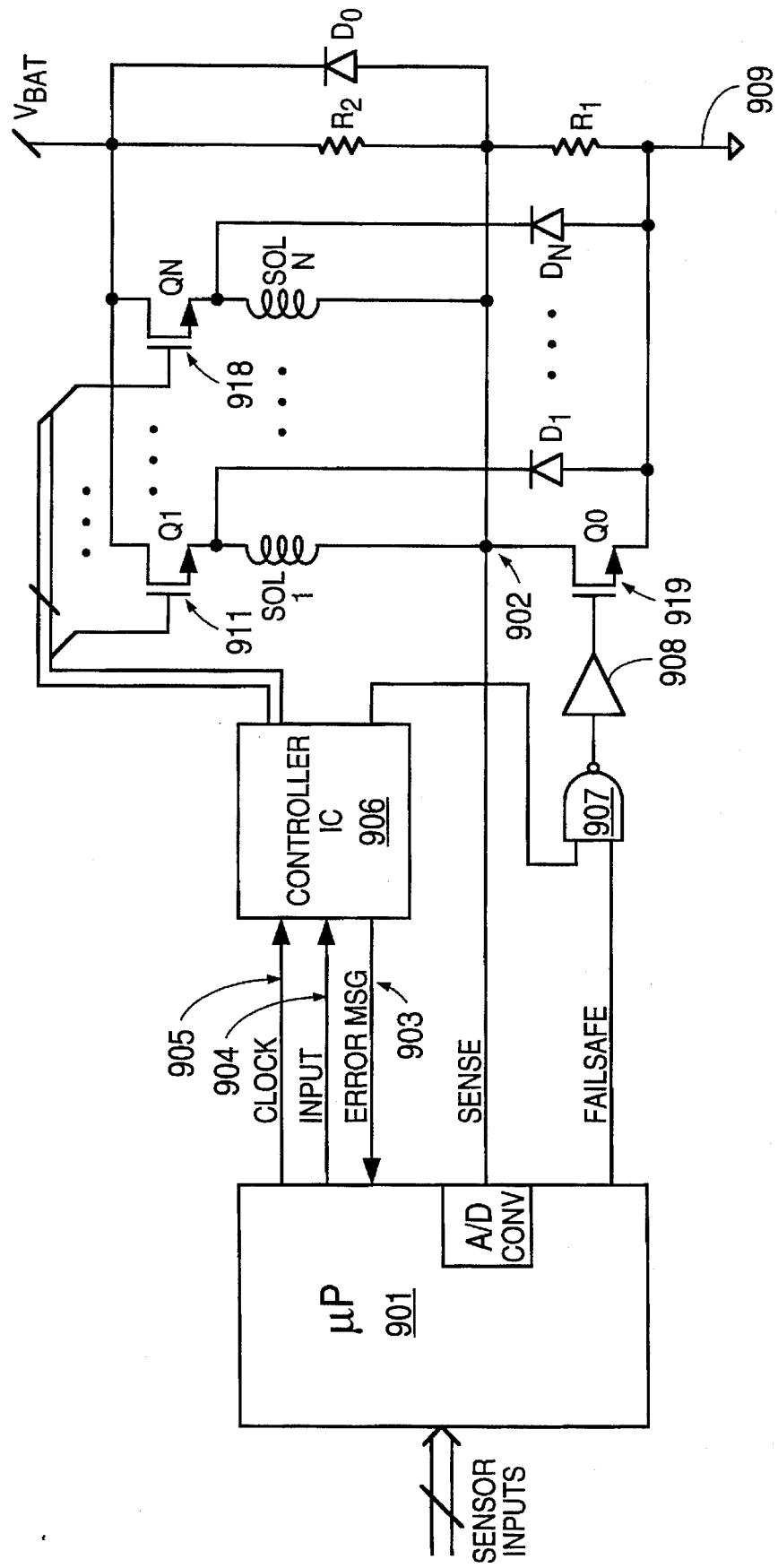
FIG. 9 is a circuit diagram of an embodiment of the invention that controls eight inductive devices and includes both a controller and a microprocessor.
Figure 10:
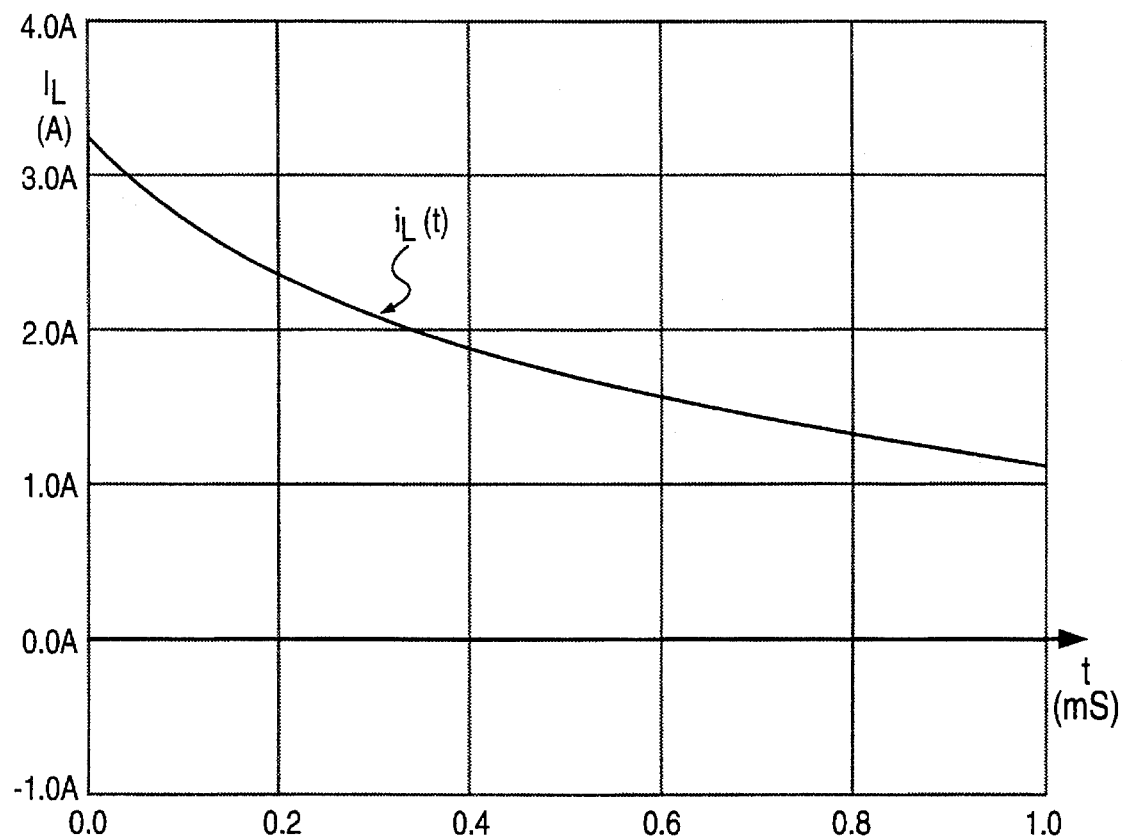
FIG. 10 is a plot of current verses time which shows the characteristic exponential current drop of an LR circuit when the current is freewheeling that is when the power supply has been removed from the circuit.

Embodiments of the invention used as a solenoid drive circuit, such as FIGS. 7, 8, and 9, generally can operate in three modes: turn on of one or more solenoids; turn off of one or more solenoids; and pulse width modulation control of the average voltage driving the solenoids. A key development of this invention is ability to independently turn on or turn off individual solenoids even though they are multiplex controlled.

In the preferred embodiments of the invention, the operation and modes are controlled by a controller 801 which can take the form of an integrated circuit as shown in FIG. 8. The controller 801 generates command signals that turn on and off the switches which activate the solenoids. The term switches includes mechanical switches, transistors, and other devices which can control the flow of current.

As shown in FIG. 7 each device to be controlled has a corresponding switch or transistor and a corresponding diode. FIG. 7 shows circuit diagram of an embodiment with N solenoids $L_1$ through $L_N$, with N transistors $Q_1$ through $Q_N$, and N diodes $D_1$ through $D_N$. To turn any solenoid on, the master transistor $Q_0$ is turned on, and a transistor corresponding to the solenoid is turned on. If more solenoids need to be turned on, the master transistor $Q_0$ is maintained on, and further appropriate transistors are turned on.

For example, to activate solenoid $L_3$, transistors $Q_3$ and $Q_0$ are switched on. This allows the power supply to drive a current through the solenoid $L_3$ by way of a path through transistor $Q_3$, solenoid $L_3$, and transistor $Q_0$. Solenoid $L_3$ is thereby activated. If later solenoid $L_2$ and solenoid $L_4$ need to be activated then transistor $Q_0$ remains on and transistors $Q_2$ and $Q_4$ are turned on.

To turn a solenoid off or turn more than one off at the same time, the transistors corresponding to the solenoids that are to remain on are left on, and the transistors corresponding to the solenoids to be turned off are turned off. The master transistor $Q_0$ is turned off for a short time. As described below, the short time is a period adequate to drive off the current in the solenoids being turned off but not long enough for the current in the solenoids that are to be left on to fall to a level causing the solenoids to turn off.

Figure 11:
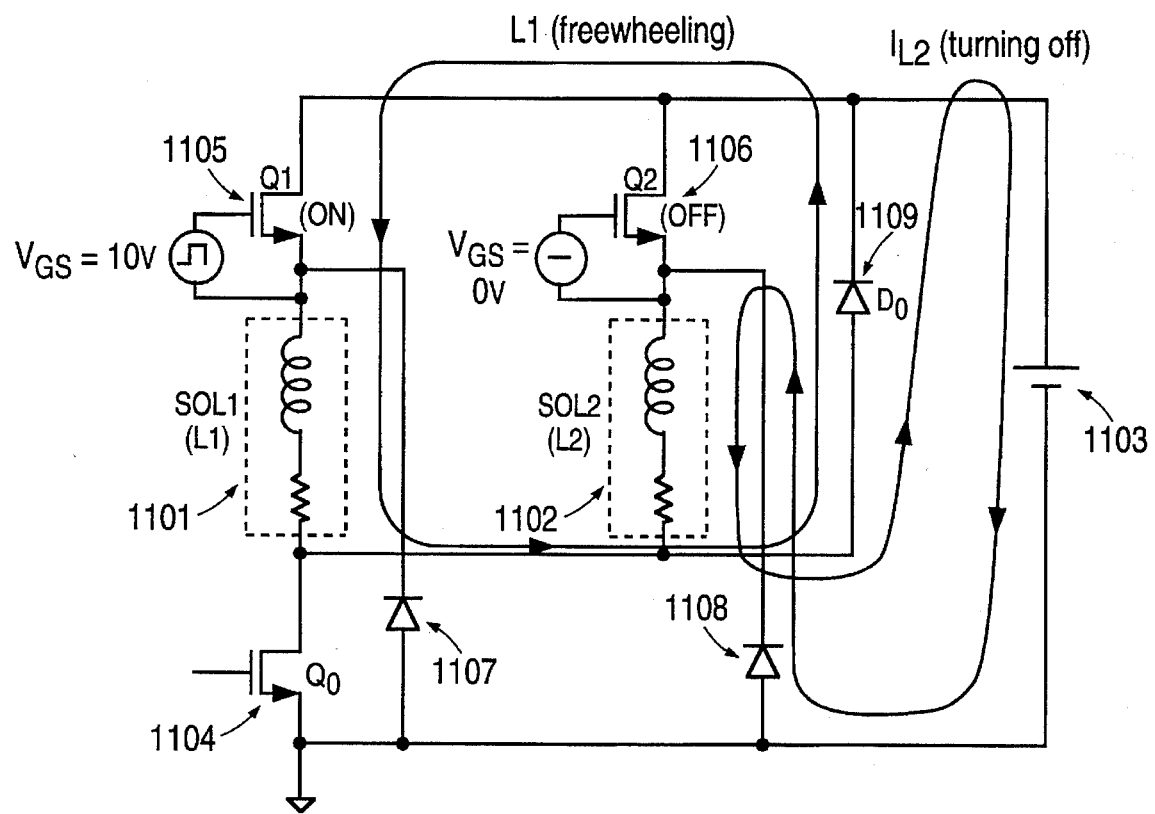
FIG. 11 is a circuit diagram of an embodiment of the invention which displays the predominant current paths when the solenoid is freewheeling and when the solenoid is turning off.

FIG. 11 shows the predominant current path when a solenoid 1102 is being turned off and solenoid 1101 is being left on. For a solenoid 1102 to be turned off, both the master transistor 1104 and the transistor 1106 corresponding the solenoid 1102 are turned off. The inductive voltage generated in the solenoid 1102 continues to drive a current which now is forced to flow in a loop through the master diode 1109, through the power supply 1103, through the diode 1108, and through the solenoid 1102. $I_{L2}$ in FIG. 11 shows the predominant current path when solenoid 1102 is being shut off. The power supply 1103 polarity is effectively reversed from when the solenoid 1102 was being activated. The power supply 1103 thus quickens the rate at which the current $I_{L2}$ falls and drives the current to zero, but the power supply cannot reverse the direction of the current because of the diodes 1109 and 1108.

Because the current runs through the power supply 1103 against the polarity of the power supply, the solenoid 1102 returns energy to the power supply 1103. This makes the driver more energy efficient and lessens problems associated with heat dissipation.

During the time the master transistor 1104 is off, the solenoids 1101 that are to stay activated freewheel. Freewheel means the current is driven by the inductive voltage generated in the solenoid, the power supply is neither aiding nor impeding the current. The predominant current path is through the solenoid 1101, through the corresponding transistor 1105 and the master diode 1109.

The current path $I_{L1}$ in FIG. 11 shows the predominant current path when solenoid 1101 is freewheeling. The current $I_{L1}$ in the solenoid 1101 drops while the solenoid is freewheeling, but the current drop is slower than the current drop for solenoids being driven off. By keeping the master switch 1104 off for only the period of time needed to deactivate the solenoids to be turned off, the solenoid 1101 to be left on retains enough current to remain activated.

The key ingredients to the multiplexing method just described is the master switch which can cause all of the inductive devices to deactivate and a means for controlling the rate at which devices deactivate. FIG. 7 is one circuit that has both the ingredients, but there are many others. The multiplexing method may be applicable to any circuit with a master switch and the ability to control the rate of deactivation. It is not necessary that the devices controlled be solenoids.

FIGS. 8 and 9 includes a circuit similar to that of FIG. 7. The embodiment shown in FIGS. 8 controls eight solenoids. All the circuit diagrams contain a master switch or master transistor and a master diode. Both the embodiment of FIG. 8 and FIG. 9 turn solenoids on and off using the method described above.

FIG. 8 shows the added feature of a controller 801 which is capable of generating the signals to the transistors which cause the solenoids to turn on and off. FIG. 9 shows the added feature of a microprocessor 901 which monitors the circuit for malfunctions and which sends signals to a controller telling the controller 906 which solenoids to turn on or off.

Besides turning solenoids on and off the invention can be use to control the power supplied to the solenoids. Pulse width modulation (PWM) may be used to control the average current through and voltage across the solenoids. The master transistor can be switched on and off with a duty cycle that maintains a desired average even though the battery voltage is higher than desired or varies.

The circuit diagram of FIG. 8 shows an embodiment of the invention where a controller 801 monitors the voltage of a power supply 803. PWM control of the solenoid voltage is accomplished by reducing a duty factor of the master transistor 806 if the measured voltage exceeds a desired voltage.

In typical operation, the duty factor might equal the ratio of the desired voltage to the measured voltage. For example, if the desired voltage is 12 V but the measured voltage is 20 V then the duty factor would be 60%. If the measured voltage is less than or equal to 12 V then the duty factor is 100%.

If voltage gets very high then the controller 801 can shut down all outputs, and the device can protect itself from damage caused by high voltage.

If current sensing is employed then the control objective of controlling current can be achieved directly. The power supply can be pulse width modulated with a duty factor equal to the ratio of a desired current and the sensed current.

The invention also includes simple methods for detecting circuit faults, such as open or shorted transistors, which is best illustrated by considering FIG. 9. Many system malfunctions can be determined by measuring voltage at a single node 902 and comparing the measured voltage to expected values.

With all transistors off the node 902 voltage should be near $\frac{1}{2} V_{BAT}$. Any substantial voltage deviation indicates one or more leaky or shorted transistors.

A check of each transistor 911 through 918 can be conducted be sequentially cycling on for a short period each transistor 911 through 918 while the master transistor 919 is off. The node 902 voltage should rise to an appropriate level for the current flowing through a transistor, a solenoid and the resistor 910. If the node voltage does not rise then either master transistor 919 is shorted or one or more transistors 911 through 918 is open.

For a final test, all transistors 911 through 918 are turned on, and the master transistor 919 is turned on for a short time, short here meaning not long enough for the solenoids to activate. The node 902 voltage should be near circuit common. A voltage above a certain level would indicate an open master transistor 919.

An alternative final test would be to have an additional transistor used as a dummy load connected to the sense node. The dummy load could be used instead of turning the transistors 911 through 918 on. A full current test could then be performed on the master transistor 919 without risk that the solenoids might activate.

If any of the above tests indicate a malfunction, the microprocessor 901 can shut off the master transistor 919 and all the solenoids. The master transistor 919 can also serve as a safety shut off to turn all solenoids off if any other error occurs. This saves the substantial cost of an additional high current solid state switch or relay.

In the embodiment shown in FIG. 9, the master switch is controlled by logic gates 907 and 908 which only allow the master transistor 919 to be switched on if the controller 906 sends a signal to turn on and the microprocessor 901 sends a fail safe signal indicating everything is OK.

Another safety feature of this invention is the method used for communication between a controller 906 and a microprocessor 901. Beside generating signals to turn on or off switches, the controller 906 may accept serial data and a clock signal from the microprocessor 901 and respond with a serial string status of the outputs.

Coded serial communications provide security from a runaway microprocessor and/or noise in the serial data link 904 between the microprocessor 901 and the drive controller 906. For example a single bit of information that instructs controller to turn on a particular solenoid may be encoded as three bits of data. The codes 101 and 010 could for example be the codes for "on" and "off." A code sent that did not match either code would be interpreted as "off," a safer condition in the case of ABS, and would indicate an error. These three bit codes have maximal coding distance between them. No single bit error, mistaking a "0" and a "1", can generate a correct code.

This is only one example of error detecting and correcting means, and other more complex symbol encoding techniques might be employed. For example the above coding provides maximum separation between code values if transmitted in parallel. Other coding techniques can be employed to detect missing bits which in effect shift the data by a single bit in a serial bit stream. Such techniques for encoding serial information are well known to those skilled in the art.

FIGS. 12a, 12b, and 12c show the logic followed by a controller in a possible embodiment of the invention. In FIG. 12a starting at 1201 the controller 906 receives an input from the microprocessor 901. The controller 906 decodes 1203 the input and determines if the input is valid. If not, the controller 906 shuts down the driver circuit 1205 and sends an error message 1206 to the microprocessor 901. If the input is valid the controller 906 determines 1207 whether microprocessor 901 requested a test of the circuit or a change in status of the solenoids, either turning on or turning off. For testing or changing status, the controller follows the methods described above, and upon completion, the controller sends a status message back to the microprocessor. The logic for turning solenoids on and off is shown in FIG. 12b. FIG. 12c shows the testing method.

Although the present invention has been described in detail, the description is only an illustration or example of the invention's application and should not be taken as a limitation. The scope of the present invention are limited only by the following claims.

I claim:

1. A method for controlling a plurality of devices using a master switch which controls the flow of power to the plurality of devices, the method comprising:

simultaneously maintaining activation of the plurality of devices;

setting rates of deactivation of the plurality of devices so that some of the plurality of devices deactivate more slowly than others;

switching the master switch off so that the plurality of devices begin to deactivate; and switching the master switch on after a time, the time being short enough so that the devices that deactivate more slowly have not deactivated enough to harm desired performance but long enough so that the other devices have deactivated.

2. A method for controlling a plurality of inductive devices, each having a first and second lead, comprising the steps of:

connecting first leads from each of a plurality of switches to a first lead of a power supply such that when a switch is turn on current can flow through the switch to a second lead of the switch but when the switch is turned off current is substantially blocked;

connecting the plurality of inductive devices to the plurality of switches such that plurality of switches and the plurality of inductive devices are in one-to-one correspondence and the second lead of each inductive device is connected to the second lead of the corresponding switch;

connecting first leads of a plurality of diodes to a second lead of the power supply;

connecting the plurality of diodes to the plurality of switches such that the plurality of diodes and the plurality of switches are in one-to-one correspondence and the second lead of each switch is connected to the second lead of the corresponding diode;

connecting all the first leads of the inductive devices to a first lead of a master switch;

connecting the second lead of the master switch to the second lead of the power supply;

connecting a first lead of a master diode to the first lead of the master switch;

connecting a second lead of the master diode to the first lead of the power supply;

simultaneously generating a first signal which keeps a first switch from the plurality of switches turned on, and a second signal which turns off a second switch from the plurality of switches; and generating on a third lead of the master switch a signal which stops current through the master switch for a time such that current through a second inductive device corresponding to the second switch stops and current through a first inductive device corresponding to the first switch does not change enough to disrupt the operation of the first inductive device.

3. The method of claim 2, further comprising:

determining a voltage for the power supply;

comparing the determined voltage to a desired voltage; and if the determined voltage is greater than the desired voltage, generating a variable signal on the third lead of the master switching device, the variable signal alternating between switching the master switch on for a time and switching the master switch off for a time.

4. The method of claim 3 wherein the step of generating a variable signal comprises generating a variable signal such that a ratio of the time the variable signal keeps the master switch on to the total time of operation is equal to a ratio of the desired voltage to the determined voltage.

5. The method of claim 2, further comprising:

determining a current through the master switch;

determining how many switches from the plurality of switches are on;

determining a desired current though the master switch when the determined number of switches are on;

comparing the determined current to the desired current; and if the determined current is greater than the desired current, generating a variable signal on the third lead of the master switching device, the variable signal alternating between switching the master switch on for a time and switching the master switch off for a time.

6. The method of claim 5 wherein the step of generating a variable signal comprises generating a variable signal such that a ratio of the time the variable signal keeps the master switch on to the total time of operation is equal to a ratio of the desired current to the determined current.

7. The method of claim 2, further comprising generating signals on third leads of the plurality of switches, which control whether each of the switches is turned off or on.

8. The method of claim 7 further comprising the step of determining a current flow through one or more inductive device from the plurality of inductive devices, and wherein:

the step of generating signals on the third leads of the plurality of switches comprises generating signals on third leads of one or more switches which correspond to the one or more inductive device for which the current flow is determined, each of the one or more switches being turned on and off by the signals so that a time average of the current through the inductive device corresponding to the switch equals a desired current through the corresponding inductive device.

9. The method of claim 2, further comprising:

generating signals on the third lead of the master switch comprises generating a signal on the third lead of the master switch so that the master switch allows current to flow through the master switch, wherein generating signals on the third leads of the plurality of switches comprises:

selecting at least one of the plurality of inductive devices, so that power can be supplied to the selected inductive devices;

selecting switches corresponding to selected inductive devices; and generating signals on the third lead of the selected switches so that the each selected switch permits current to flow, whereby the power supply can drive a current through the selected inductive devices.

* * * * *